US012424575B2

(12) United States Patent
Oh et al.

(10) Patent No.: US 12,424,575 B2
(45) Date of Patent: Sep. 23, 2025

(54) THREE-DIMENSIONAL SEMICONDUCTOR DEVICE

(71) Applicant: SK hynix Inc., Icheon-si (KR)

(72) Inventors: Sung Lae Oh, Icheon-si (KR); Sang Hyun Sung, Icheon-si (KR); Hyun Soo Shin, Icheon-si (KR); Kang Sik Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 644 days.

(21) Appl. No.: 17/855,241

(22) Filed: Jun. 30, 2022

(65) Prior Publication Data

US 2023/0282603 A1 Sep. 7, 2023

(30) Foreign Application Priority Data

Mar. 7, 2022 (KR) .................. 10-2022-0028652

(51) Int. Cl.
  *H01L 25/065* (2023.01)
  *H01L 23/00* (2006.01)
  *H01L 25/18* (2023.01)

(52) U.S. Cl.
  CPC .......... *H01L 24/08* (2013.01); *H01L 25/0657* (2013.01); *H01L 25/18* (2013.01); *H01L 2224/08145* (2013.01); *H01L 2924/1431* (2013.01); *H01L 2924/1434* (2013.01)

(58) Field of Classification Search
  CPC ....... H01L 25/0657; H01L 2224/08145; H01L 2924/1431; H01L 2924/1434; H01L 24/08; H01L 25/18; H10B 41/40; H10B 41/50; H10B 43/40; H10B 43/50; H10B 43/30; H10B 41/30
  See application file for complete search history.

(56) References Cited

U.S. PATENT DOCUMENTS

| 9,601,577 B1* | 3/2017 | Lee | ..................... H10D 84/0144 |
| 2018/0308559 A1* | 10/2018 | Kim | ..................... H10B 43/10 |

FOREIGN PATENT DOCUMENTS

| KR | 10-2019-0015773 A | 2/2019 |
| KR | 10-2020-0093481 A | 8/2020 |
| KR | 10-2021-0018608 A | 2/2021 |
| KR | 10-2021-0026963 A | 3/2021 |

* cited by examiner

*Primary Examiner* — Thanh Y. Tran

(57) ABSTRACT

A three-dimensional semiconductor device includes a peripheral circuit device layer that includes a page buffer area, a pass transistor area adjacent to the page buffer layer, and a logic transistor area adjacent to the pass transistor area in the first direction, and a memory cell device layer that includes a cell area and a staircase area extending from the cell area. The peripheral circuit device layer includes transistors, peripheral circuit via plugs, and peripheral circuit interconnection layers on a substrate. The memory cell device layer includes word line stack including interlayer insulating layers and word lines alternately stacked, the word line stack including end portions stacked in a staircase in the staircase area; a bit line array including bit lines arranged in the cell area; and word line pillars electrically connected to the end portions of the word lines in the staircase area, respectively.

18 Claims, 5 Drawing Sheets

THREE-DIMENSIONAL SEMICONDUCTOR DEVICE

CROSS-REFERENCE TO RELATED APPLICATIONS

The present application claims priority to Korean Patent Application No. 10-2022-0028652, filed on Mar. 7, 2022, in the Korean Intellectual Property Office, which is herein incorporated by reference in its entirety.

BACKGROUND

1. Field

The present disclosure relates to a three-dimensional semiconductor device having a stacked peripheral circuit device layer and a memory cell device layer.

2. Description of the Related Art

A three-dimensional semiconductor device having a stacked peripheral circuit device layer and a memory cell device layer has been introduced.

SUMMARY

An embodiment of the present disclosure provides a three-dimensional semiconductor device that includes a peripheral circuit device layer and a memory cell device layer stacked over the peripheral circuit device layer. The peripheral circuit device layer includes a page buffer area, a pass transistor area adjacent to the page buffer layer in a first direction, and a logic transistor area adjacent to the pass transistor area in the first direction. The memory cell device layer includes a cell area and a staircase area extending from the cell area in the first direction. The peripheral circuit device layer includes transistors, peripheral circuit via plugs, and peripheral circuit interconnection layers on a substrate. The memory cell device layer includes word line stack including interlayer insulating layers and word lines alternately stacked, wherein the word line stack includes end portions arranged in a staircase shape in the staircase area; a bit line array including bit lines arranged in the cell area; and word line pillars electrically connected to the end portions of the word lines in the staircase area, respectively. The pass transistor area is vertically overlapped with the cell area.

An embodiment of the present disclosure provides a three-dimensional semiconductor device includes a peripheral circuit device layer and a memory cell device layer stacked over the peripheral circuit device layer. The peripheral circuit device layer includes a page buffer area and a row decoder area adjacent to the page buffer area in a first direction. The memory cell device layer includes a cell area and a staircase area extending from the cell area in the first direction. A first portion of the row decoder area is vertically aligned with the cell area. A second portion of the row decoder is vertically aligned with the staircase area.

An embodiment of the present disclosure provides a three-dimensional semiconductor device includes a bit line array including a plurality of bit lines arranged to be spaced apart from each other in a first direction and to extend in parallel with each other in a second direction, the first direction being perpendicular to the second direction; and a page buffer area including a plurality of page buffer transistors arranged to be spaced apart from each other in the first direction. The plurality of bit lines are arranged in the first direction to form a plurality of bit line groups. Each of the plurality of bit line groups includes some of the bit lines. The bit line groups are arranged with a first pitch in the first direction. The plurality of buffer transistors are arranged with a second pitch in the first direction. The first pitch is greater than the second pitch.

DETAILED DESCRIPTION

Figure 1A:
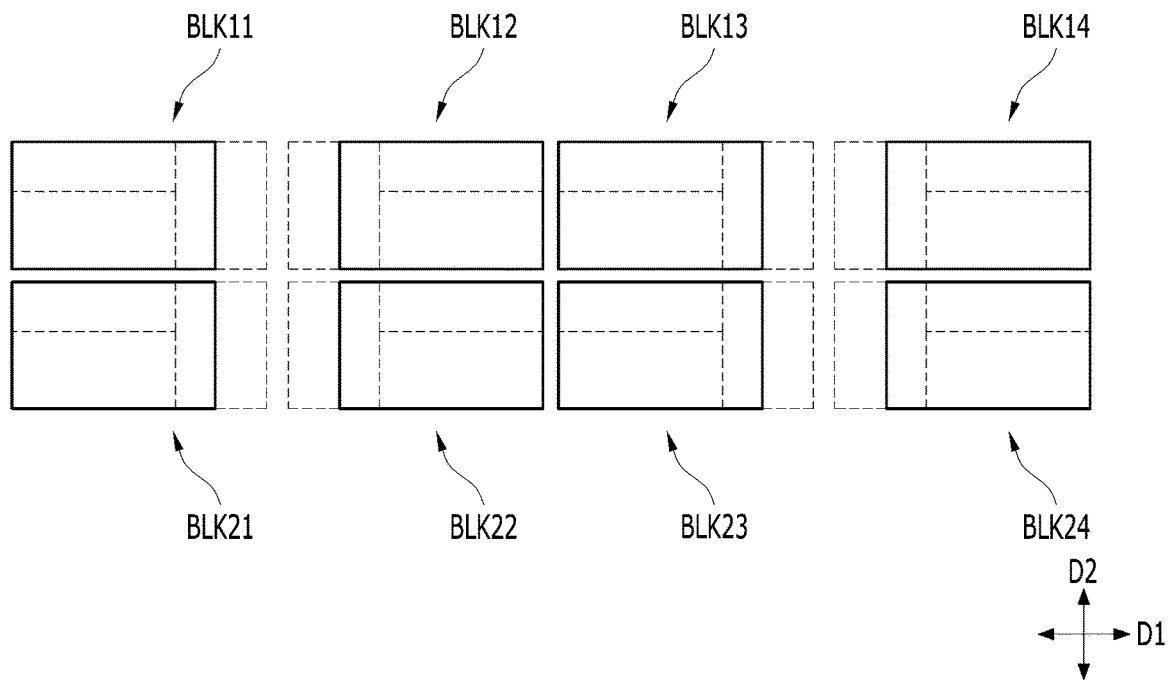
FIG. 1A is a layout schematically illustrating an arrangement of unit blocks of a three-dimensional semiconductor device according to an embodiment of the present disclosure.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that, although the terms "first" and/or "second" may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Other expressions that explain the relationship between elements, such as "between", "directly between", "adjacent to" or "directly adjacent to" should be construed in the same way.

The drawings are not necessarily to scale and, in some instances, proportions may have been exaggerated in order to clearly illustrate features of the embodiments. When a first layer is referred to as being "on" a second layer or "on" a substrate, it not only refers to a case where the first layer is formed directly on the second layer or a substrate, but also to cases in which the first layer is formed over the second layer or a substrate, with or without intervening structures.

An embodiment of the present disclosure provides a three-dimensional semiconductor device having a cell area and a pass transistor area that vertically overlap with each other.

An embodiment of the present disclosure discloses reduction in a chip size of a three-dimensional semiconductor device.

An embodiment of the present disclosure provides an electrical connection structure of an offset (or mis-aligned) peripheral circuit via plugs using peripheral circuit interconnections.

Figure 1B:
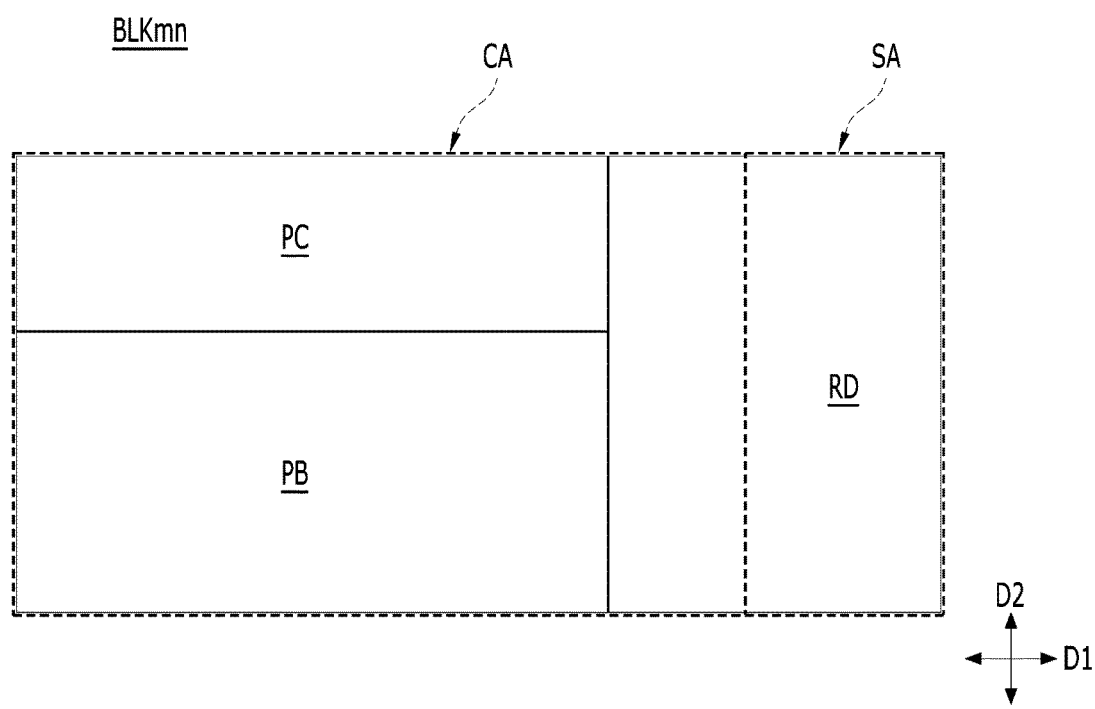
FIG. 1B is an enlarged view of one unit block of the unit blocks of FIG. 1A.
Figure 1C:
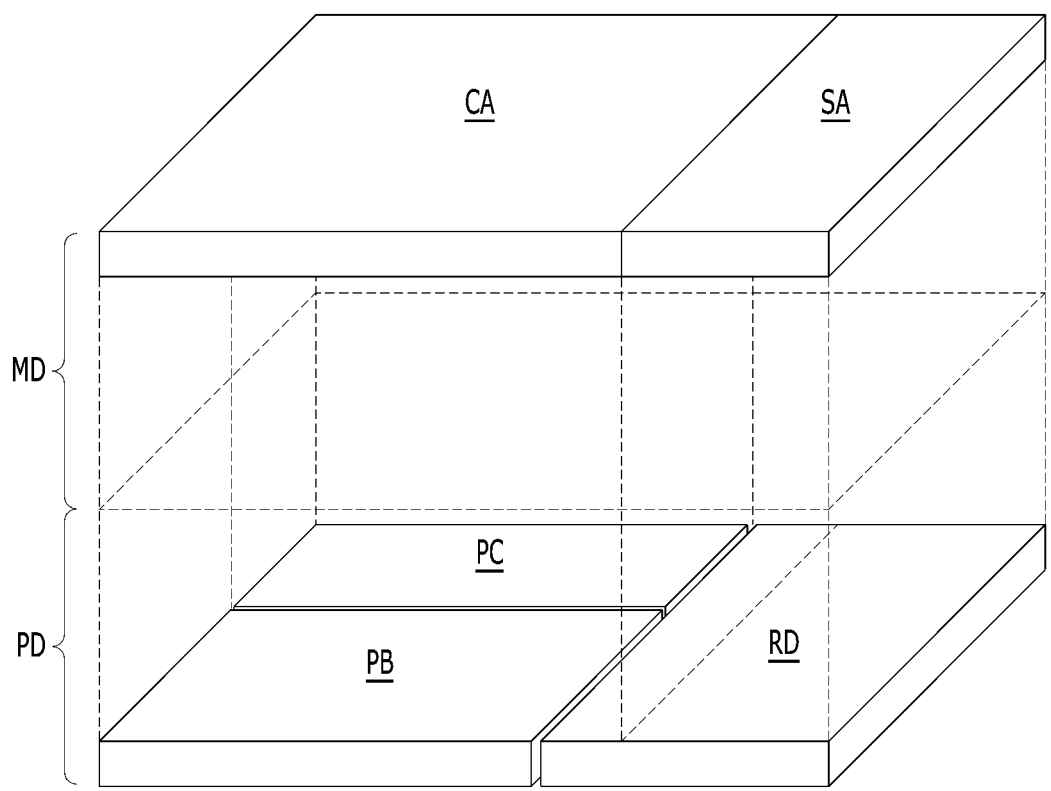
FIG. 1C is a three-dimensional view of the unit block of the unit blocks of FIGS. 1A and 1B.
Figure 1C:
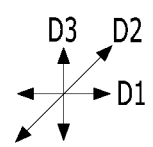

FIG. 1A is a layout schematically illustrating an arrangement of unit blocks BLK11-BLK24 of a three-dimensional semiconductor device according to an embodiment of the present disclosure, FIG. 1B is an enlarged view of one unit block BLKmn (where "m" and "n" are natural numbers) of the unit blocks BLK11-BLK24 of FIG. 1A, and FIG. 1C is a three-dimensional view of the unit block BLKmn of the unit blocks BLK11-BLK24 of FIGS. 1A and 1B.

Referring to FIGS. 1A to 1C, a three-dimensional semiconductor device according to an embodiment of the present disclosure may include a plurality of unit blocks BLK11-BLK24, which are arranged in a matrix form. For example, in FIG. 1A, the plurality of unit blocks BLK11-BLK24 arranged in the matrix form of 2 rows and 4 columns. In some embodiments, the unit blocks BLK11-BLK24 may be arranged in in a matrix form of 2 rows and 2 columns, a matrix form of 4 rows and 4 columns, a matrix form of 4 rows and 2 columns, or other various matrix forms.

Referring to FIGS. 1B and 1C, each of the unit blocks BLK11-BLK24, represented by a unit block BLKmn, may include a peripheral circuit device layer PD and a memory cell device layer MD. The memory cell device layer MD may be stacked on the peripheral circuit device layer PD in a direction D3. The memory cell device layer MD may include a cell area CA and a staircase area SA. The cell area CA and the staircase area SA may be adjacent to each other in a horizontal direction. For example, the staircase area SA may extend from the cell area CA horizontally in a first direction D1. The peripheral circuit device layer PD may include a peripheral circuit area PC, a page buffer area PB, and a row decoder area RD. The peripheral circuit area PC and the page buffer area PB may be adjacent to each other horizontally in a second direction D2. The second direction D2 may be perpendicular to the first direction D1. The peripheral circuit area PC and the page buffer area PB may be horizontally adjacent to the row decoder area RD in the first direction D1.

The peripheral circuit area PC and the page buffer area PB of the peripheral circuit device layer PD may be vertically overlapped with the cell area CA of the memory cell device layer MD. The row decoder area RD of the peripheral circuit device layer PD may be vertically overlapped with a portion of the cell area CA and with the staircase area SA of the memory cell device layer MD. For example, a first portion of the row decoder area RD of the peripheral circuit device layer PD may be vertically overlapped with the portion of the cell area CA of the memory cell device layer MD, and a second portion of the row decoder area RD of the peripheral circuit device layer PD may be vertically overlapped with the staircase area SA of the memory cell device layer MD.

Figure 2A:
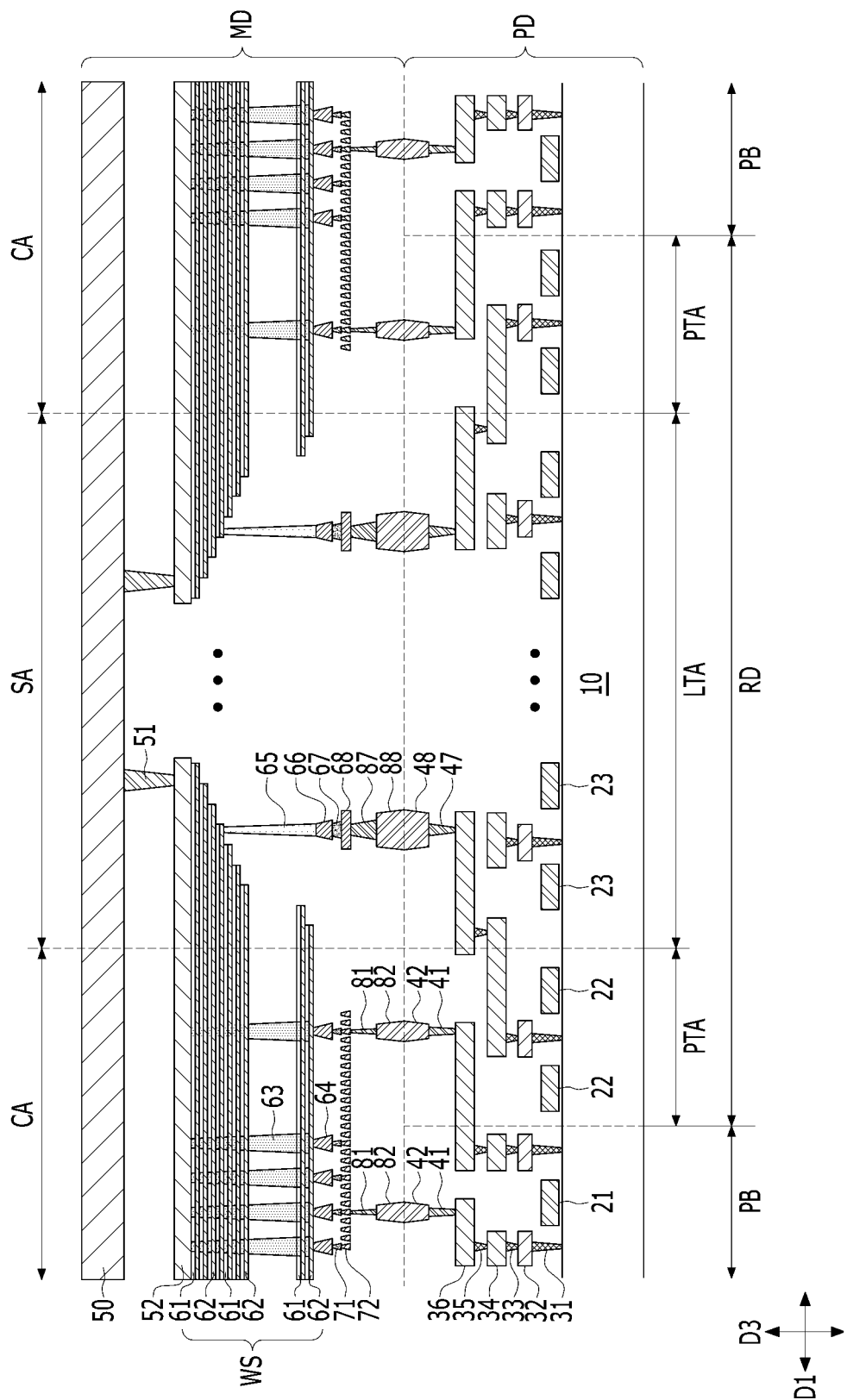
FIG. 2A is a cross-sectional view of a three-dimensional semiconductor device according to an embodiment of the present disclosure.

FIG. 2A is a cross-sectional view of a three-dimensional semiconductor device according to an embodiment of the present disclosure. Referring to FIG. 2A, a three-dimensional semiconductor device according to an embodiment of the present disclosure may include a peripheral circuit device layer PD and a memory cell device layer MD stacked on the peripheral circuit device layer PD. The peripheral circuit device layer PD may include a page buffer area PB and a row decoder area RD. The row decoder area RD may include a pass transistor area PTA and a logic transistor area LTA. The peripheral circuit device layer PD may include transistors 21, 22, and 23, peripheral circuit via plugs 31, 33, and 35, peripheral circuit interconnections 32, 34, and 36, lower bonding via plugs 41 and 47, and a plurality of lower bonding pads 42 and 48 disposed on a substrate 10. The substrate 10 may include a semiconducting material layer such as a silicon wafer.

The transistors 21, 22, and 23 may include page buffer transistors 21 disposed in the page buffer area PB, pass transistors 22 disposed in the pass transistor area PTA of the row decoder area RD, and logic transistors 23 disposed in the logic transistor area LTA of the row decoder area RD.

The peripheral circuit via plugs 31, 33, and 35 may include lower peripheral circuit via plugs 31, intermediate peripheral circuit via plugs 33, and upper peripheral circuit via plugs 35. The peripheral circuit interconnection layers 32, 34, and 36 may include lower peripheral circuit interconnection layers 32, intermediate peripheral circuit interconnection layers 34, and upper peripheral circuit interconnection layers 36. Each of the peripheral circuit via plugs 31, 33, and 35 may have a vertically extending structure, and each of the peripheral circuit interconnection layers 32, 34, and 36 may have a horizontally extending structure. The lower peripheral circuit via plugs 31 may electrically connect the substrate 10 to the lower peripheral circuit interconnection layers 32. The intermediate peripheral circuit via plugs 33 may electrically connect the lower peripheral circuit interconnection layers 32 to the intermediate peripheral circuit interconnection layers 34. The upper peripheral circuit via plugs 35 may electrically connect the intermediate peripheral circuit interconnection layers 34 to the upper peripheral circuit interconnection layers 36. Each of the peripheral circuit via plugs 31, 33, and 35 and each of the peripheral circuit interconnection layers 32, 34, and 36 may include a conductor such as a doped silicon, a metal, a metal silicide, a metal compound, or a metal alloy.

The lower bonding via plugs 41 and 47 may include lower bit line bonding via plugs 41 and lower word line bonding via plugs 47. The lower bonding pads 42 and 48 may include lower bit line bonding pads 42 and lower word line bonding pads 48. Each of the lower bit line bonding pads 42 may be disposed on each of the lower bit line bonding via plugs 41, and each of the lower word line bonding pads 48 may be disposed on each of the lower word line bonding via plugs 47.

Each of the lower bonding via plugs 41 and 47 and each of the lower bonding pads 42 and 48 may include a conductor such as a metal or a metal alloy. The lower bit line bonding via plugs 41 may electrically connect the lower bit line bonding pads 42 to the corresponding upper peripheral circuit interconnection layers 36, respectively. The lower word line bonding via plugs 47 may electrically connect the lower word line bonding pads 48 and the corresponding upper peripheral circuit interconnection layers 36, respectively.

The memory cell device layer MD may include a cell area CA and a staircase area SA. The memory cell device layer MD may include a base layer 50, a common source via plug 51, a common source layer 52, a word line stack WS, channel pillars 63, channel contact plugs 64, bit line via plugs 71, bit lines 72, word line pillars 65, word line contact plugs 66, word line via plugs 67, word line intermediate pads 68, upper bonding via plugs 81 and 87, and upper bonding pads 82 and 88. The upper bonding via plugs 81 and 87 may include upper bit line bonding via plugs 81 and upper word line bonding via plugs 87. The upper bonding pads 82 and 88 may include upper bit line bonding pads 82 and upper word line bonding pads 88. Each of the upper bit line bonding pads 82 may be disposed under the corresponding upper bit line bonding via plugs 81, and each of the upper word line bonding pads 88 may be disposed under the corresponding upper word line bonding via plugs 87. Each of the lower bit line bonding pads 42 and the corresponding upper bit line bonding pads 82 may be in contact and may be bonded each other. Each of the lower word line bonding pads 48 and the corresponding upper word line bonding pads 88 may be in contact and may be bonded each other.

The base layer 50 may include a conductor such as a metal or a metal compound. The base layer 50 may be formed in a line shape or a rail shape. The common source via plug 51 may electrically connect the base layer 50 to the common source layer 52. The common source layer 52 may supply power to the channel pillars 63. The common source layer 52 may be formed in a plate shape. The common source via plug 51 and the common source layer 52 may include a conductor such as a metal, a metal silicide, a metal compound, or a metal alloy.

The word line stack WS may include interlayer insulating layers 61 and word lines 62, alternately stacked. The word lines 62 may include a conductor such as a metal. The interlayer insulating layers 61 may include an insulating material such as silicon oxide ($SiO_2$). End portions of the interlayer insulating layers 61 and the word lines 62 may be stacked to form a staircase shape in the staircase area SA.

The channel pillars 63 may vertically pass through the word line stack WS in the cell area CA to be electrically connected to the common source layer 52. The channel pillars 63 may have a pillar shape and may each include a channel layer, a tunneling layer, a memory layer, a blocking layer, and a barrier layer.

The channel contact plugs 64 may electrically connect the channel layer of the channel pillars 63 to the corresponding bit line via plugs 71 in the cell area CA. The channel contact plugs 64 may include a conductor such as a metal, a metal silicide, a metal compound, or a metal alloy.

The bit line via plugs 71 may electrically connect the corresponding channel contact plugs 64 to the corresponding bit lines 72.

The bit lines 72 may correspond to the channel pillars 63, respectively. The bit lines 72 may have a line shape extending horizontally. The bit lines 72 may include a conductor such as a metal, a metal silicide, a metal compound, a metal alloy.

The word line pillars 65 may have a pillar shape extending vertically. Each of the word line pillars 65 may be connected to an exposed end of a corresponding word line 61 in the staircase area SA.

The word line contact plugs 66 may electrically connect each of the word line pillars 65 to the corresponding word line via plugs 67. The word line contact plugs 66 may be disposed at the same horizontal level as the channel contact plugs 64. The word line contact plugs 66 may include the same material as the channel contact plugs 64.

The word line via plugs 67 may electrically connect each of the word line contact plugs 66 to the corresponding word line intermediate pads 68. The word line via plugs 67 may be disposed at the same horizontal level as the bit line via plugs 71.

The word line intermediate pads 68 may electrically connect each of the word line via plugs 67 to the corresponding upper word line bonding via plug 87. The word line intermediate pads 68 may be disposed at the same horizontal level as the bit lines 72. The word line intermediate pads 68 may include the same material as the bit lines 72.

The upper bit line bonding via plugs 81 may connect each of the bit lines 72 to the corresponding upper bit line bonding pads 82. The upper word line bonding via plugs 87 may connect each of the word line intermediate pads 68 to the corresponding upper word line bonding pads 88.

Each of the upper bit line bonding pads 82 may be bonded to a corresponding lower bit line bonding pad 42.

Each of the upper word line bonding pads 88 may be bonded to a corresponding lower word line bonding pad 48.

Each of the page buffer transistors 21 may be electrically connected to a corresponding bit line 72. Accordingly, the page buffer transistors 21 may be electrically connected to the channel pillars 63 through the corresponding bit lines 72. The pass transistors 22 may be electrically connected to the corresponding word lines 62.

The lower bit line bonding plugs 41 and the lower bit line bonding pads 42 may be dispersedly disposed in the page buffer area PB and the pass transistor area PTA. That is, the lower bit line bonding plugs 41 and the lower bit line bonding pads 42 disposed in the page buffer area PB and the pass transistor area PTA may be electrically connected to the page buffer transistors 21 in the page buffer area PB. The peripheral circuit interconnection layers 32, 34, and 36 and the peripheral circuit via plugs 31, 33, and 35 may electrically connect the corresponding lower bit line bonding pads 42 to the corresponding page buffer transistors 21. The peripheral circuit interconnection layers 32, 34, and 36 and the peripheral circuit via plugs 31, 33, and 35 may be electrically connected to active regions, i.e., source/drain regions of the corresponding page buffer transistors 21 disposed in the page buffer area PB. The source/drain regions may be formed in the substrate 10.

The lower bit line bonding via plugs 41 and the corresponding upper peripheral circuit via plugs 35 may not be vertically aligned. For example, the lower bit line bonding via plugs 41 and the upper peripheral circuit via plugs 35 may be offset, and electrically connected with each other through the upper peripheral circuit interconnection layers 36, which extend horizontally in the first direction D1. For example, each of the lower bit line bonding via plugs 41 may be disposed closer in the first direction D1 to the row decoder area RD or the staircase area SA than the corresponding upper peripheral circuit via plugs 35, and each of the upper peripheral circuit via plugs 35 may be disposed closer in the first direction D1 to the page buffer area PB or the cell area CA than the corresponding lower bit line bonding via plugs 41.

The upper peripheral circuit interconnection layers 36 connected to the lower bit line bonding via plugs 41 disposed in the pass transistor area PTA may extend further horizontally than the upper peripheral circuit interconnection layers 36 connected to the lower bit line bonding via plugs 41 disposed in the page buffer area PB. Accordingly, an offset distance between each of the lower bit line bonding via plugs 41 disposed in the pass transistor area PTA and the corresponding upper peripheral circuit via plug 35 disposed in the page buffer area PB may be greater than the offset distance between each of the lower bit line bonding via plugs 41 disposed in the page buffer area PB and the corresponding upper peripheral circuit via plugs 35 disposed in the page buffer area PB.

In another embodiment, each of the lower bit line bonding via plugs 41 and the corresponding upper peripheral circuit via plugs 35 may be offset horizontally through at least one of the lower peripheral circuit interconnection layers 32, the intermediate peripheral circuit interconnection layers 34, or the upper peripheral circuit interconnection layers 36. That is, the lower peripheral circuit interconnection layers 32 or the intermediate peripheral circuit interconnection layers 34 may also extend horizontally to offset the lower bit line bonding via plugs 41 from the corresponding lower peripheral circuit via plugs 31.

In another embodiment, the peripheral circuit device layer PD may further include top peripheral circuit via plugs (not illustrated) and top peripheral circuit interconnection layers (not illustrated) on the upper peripheral circuit interconnection layers 36. Each of the top peripheral circuit via plugs may electrically connect the corresponding top peripheral circuit interconnection layers to the corresponding upper peripheral circuit interconnection layers 36. Each of the top peripheral circuit interconnection layers may electrically connect the corresponding lower bit line bonding via plugs 41 to the corresponding top peripheral circuit via plugs. Each of the top peripheral circuit interconnection layers may extend horizontally to offset the corresponding lower bit line bonding via plugs 41 from the corresponding top peripheral circuit via plugs so that they are not vertically aligned.

In another embodiment, each of the lower bit line bonding via plugs 41 and the corresponding upper peripheral circuit via plugs 35 may be offset through at least two selected from the lower peripheral circuit interconnection layers 32, the intermediate peripheral circuit interconnection layers 34, the upper peripheral circuit interconnection layer 36, and the top peripheral circuit interconnection layers.

The page buffer area PB may include a column decoder. For example, the page buffer area PB may further include sense amplifying circuits to amplify electrical signals received from the bit lines 72. The page buffer area PB may further include cache circuits.

The peripheral circuit area PC may include voltage generation circuits, control circuits, or input and output (IO) circuits.

Figure 2B:
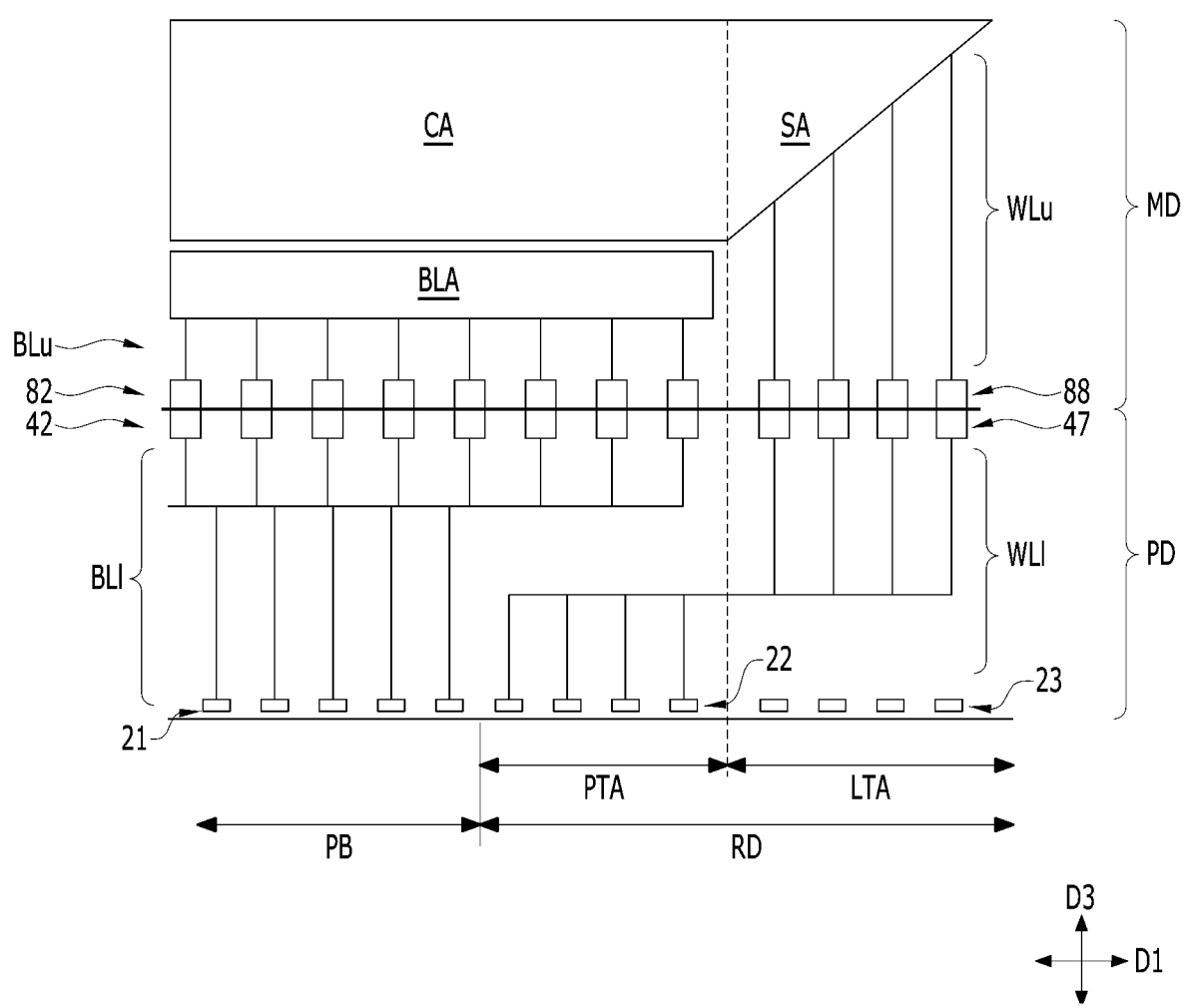
FIG. 2B is a schematically simplified diagram illustrating electrical connections of a three-dimensional semiconductor device according to an embodiment of the present disclosure shown in FIG. 2A.

FIG. 2B is a schematically simplified diagram illustrating electrical connections of a three-dimensional semiconductor device according to an embodiment of the present disclosure shown in FIG. 2A. Referring to FIG. 2B, the cell area CA and the bit line array BLA may be vertically overlapped in the memory cell device layer MD. The cell area CA and the bit line array BLA of the memory cell device layer MD may be vertically overlapped with the page buffer area PB and the pass transistor area PTA of the peripheral circuit device layer PD. The staircase area SA of the memory cell device layer MD may be vertically overlapped with the logic transistor area LTA of the peripheral circuit device layer PD.

Each of the bit lines (72 in FIG. 2A) in the bit line array BLA may be electrically connected to the corresponding page buffer transistors 21 disposed in the page buffer area PB through the corresponding upper bit line interconnections BLu, the corresponding upper bit line bonding pads 82, the corresponding lower bit line bonding pads 42, and the corresponding lower bit line interconnections BLI. Accordingly, the bit lines 72 may be vertically overlapped with the page buffer area PB and the pass transistor area PTA of the peripheral circuit device layer PD.

End portions of the word lines (61 of FIG. 2) stacked and disposed in the staircase area SA of the memory cell device layer MD may be electrically connected to the corresponding pass transistors 22 disposed in the pass transistor area PTA through the corresponding upper word line interconnections WLu, the corresponding upper word line bonding pads 88, the corresponding lower word line bonding pads 48, and the corresponding lower word line interconnections WLI.

Although the lower bit line interconnections BLI are shown as being connected to one another as a whole, each of the lower bit line interconnections BLI may be insulated from one another. Also, although the lower word line interconnections WLI are shown as being connected to one another as a whole, each of the lower word line interconnections WLI may be insulated from one another.

Although the lower bit line interconnections BLI are illustrated as being connected to the gate electrodes of the page buffer transistors 21 to easily understand the technical concept of the present disclosure, more accurately, the lower bit line interconnections BLI may be connected to active regions, i.e., source/drain regions, of the page buffer transistors 21. That is, the lower bit line interconnections BLI may be electrically connected to the substrate 10 of the page buffer area PB of the peripheral circuit device layer PD on which the page buffer transistors 21 are disposed. Also, although the lower word line interconnections WLI are illustrated as being connected to gate electrodes of the pass transistors 22, more accurately, the lower word line interconnections WLI may be connected to active regions, i.e., source/drain regions, of the pass transistors 22. That is, the lower word line interconnections WL1 may be electrically connected to the substrate 10 of the pass transistor area PTA of the peripheral circuit device layer PD, on which the pass transistors 22 are disposed.

By maintaining the same intervals between the bit lines 72, and reducing intervals between the page buffer transistors 21 and between the pass transistors 22, the chip area can be efficiently used. That is, the chip can be more integrated.

Figure 3A:
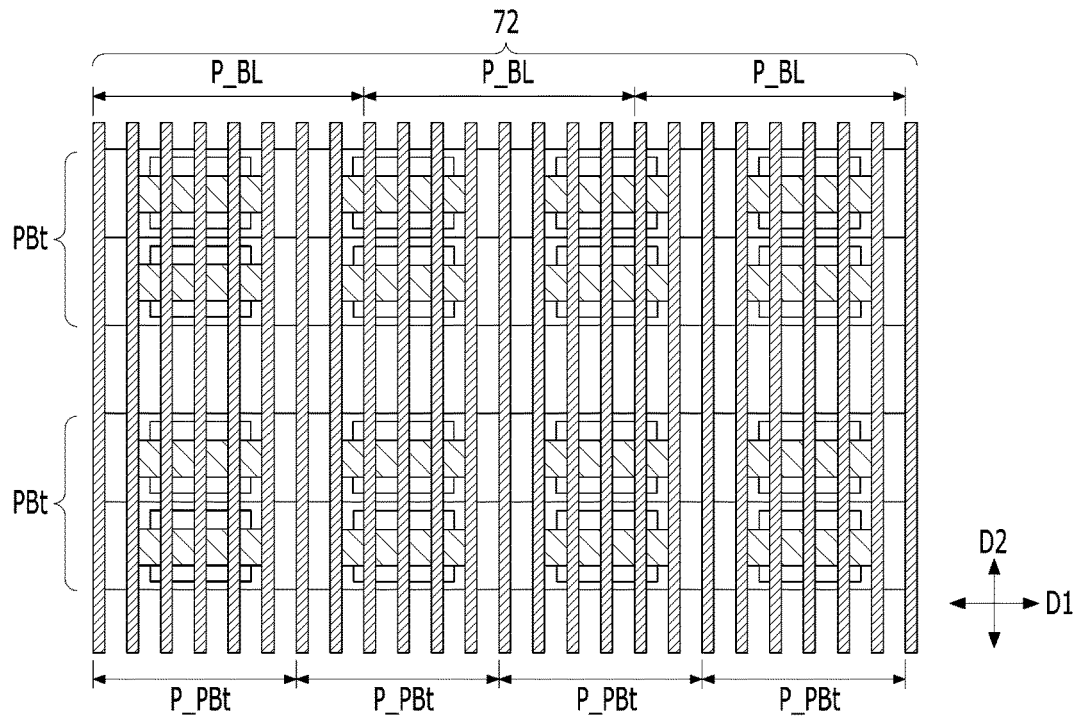
FIGS. 3A and 3B are a top view and an enlarged view illustrating bit lines in the cell area and page buffer transistors in the page buffer area that overlap with each other according to an embodiment of the disclosure.
Figure 3B:
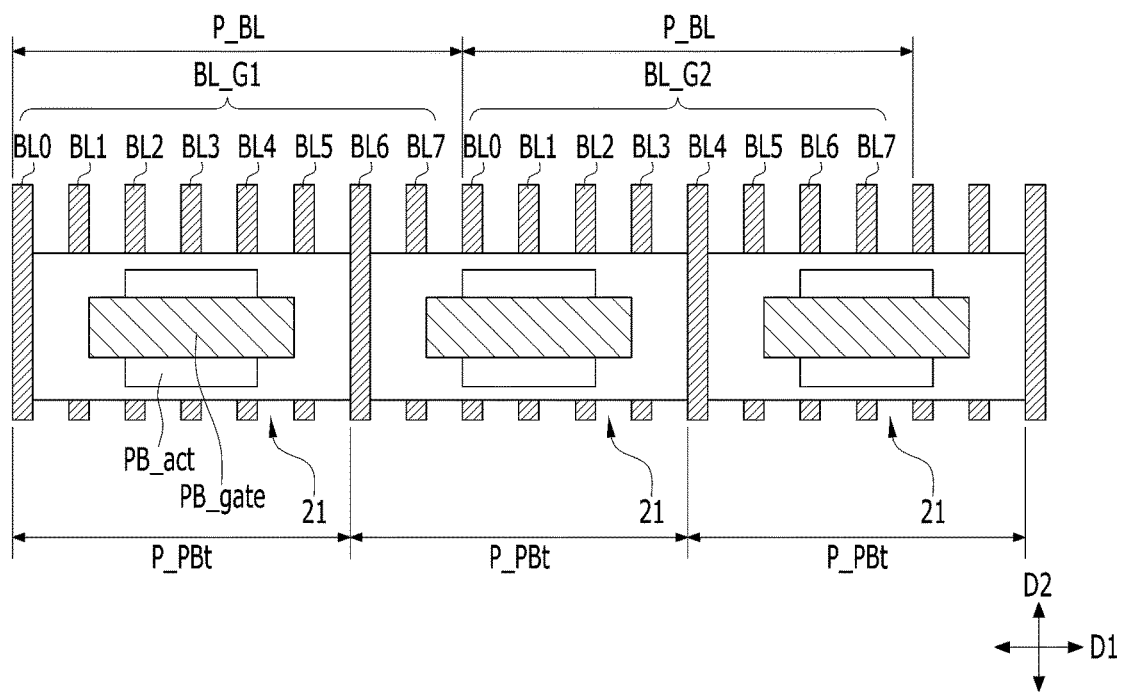

FIGS. 3A and 3B are a top view and an enlarged view illustrating bit lines 72 in the cell area CA and the page buffer transistors 21 in a page buffer transistor area PBt of the page buffer area PB, which overlap with each other according to an embodiment of the present disclosure. The bit lines BL0-BL7 are highlighted in FIG. 3A, and the transistors 21 are highlighted in FIG. 3B. Referring to FIGS. 3A and 3B, parallel bit lines 72 in the cell area CA of the three-dimensional semiconductor device may be spaced apart from each other in a first direction D1, and may be arranged to extend in a second direction D2. Some of the bit lines 72, for example, eight bit lines 72 may constitute one bit line group BL_G1 or BL_G2. Each of the page buffer transistors 21 may have a rectangular shaped active region PB_act and a segment shaped gate electrode PB_gate that is elongated in the first direction D1. The page buffer transistors 21 may be arranged spaced apart and in parallel with each other in both the first direction D1 and the second direction D2.

The bit lines 72 may be arranged to be spaced apart from each other at uniform intervals or a uniform pitch in the first direction D1. Accordingly, the bit line groups BL_G1 and BL_G2 may be arranged to have the same bit line group pitch P_BL in the first direction D1. The bit line group pitch P_BL may refer to a distance from a first start point or a first start line of the first bit line group BL_G1 to a second start point or a second start line of the second bit line group BL_G2 that is adjacent to the first bit line group BL_G1 in the first direction D1. The page buffer transistors 21 may be arranged to have the same transistor pitch P_PBt in the first direction D1. The transistor pitch P_PBt may refer to a distance from a first start point or a first start line of a first page buffer transistor 21 to a second start point or a second start line of a second page buffer transistor 21 adjacent to the first page buffer transistor 21 in the first direction D1. The bit line group pitch P_BL may be greater than the transistor pitch P_PBt. For example, the bit line group pitch P_BL may include eight bit lines 72, and the transistor pitch P_PBt may include six bit lines 72. In another embodiment, the transistor pitch P_PBt may include the seven bit lines 72. In another embodiment, the transistor pitch P_PBt may include five or fewer bit lines 72. The bit lines 72 and the page buffer transistors 21 may correspond to each other. Accordingly, because the transistor pitch P_PBt is smaller than the bit line group pitch P_BL, the page buffer area PB may be shorter than the cell area CA in the first direction D1. As a result, the pass transistor area PTA may be vertically overlapped with the cell area CA.

In an embodiment, the pass transistors 22 disposed in the pass transistor area PTA may also be arranged to have the transistor pitch P_PBt of the page buffer transistors 21. That is, the transistor pitch P_PBt may be greater than the pitch of the pass transistors 22 disposed in the pass transistor area PTA.

According to embodiments of the present disclosure, a chip size of a three-dimensional semiconductor device can be reduced.

Although the present invention has been specifically described according to the above-described preferred embodiments, it should be noted that the above-described embodiments are for the purpose of explanation and not for the limitation thereof. In addition, it will be appreciated by the person having ordinary skill in the art that various modifications of the described embodiments and other embodiments are possible within the scope of the present invention.

What is claimed is:

1. A three-dimensional semiconductor device comprising:
a peripheral circuit device layer and a memory cell device layer over the peripheral circuit device layer,
wherein the peripheral circuit device layer includes a page buffer area, a pass transistor area adjacent to the page buffer layer in a first direction, and a logic transistor area adjacent to the pass transistor area in the first direction,
wherein the memory cell device layer includes a cell area and a staircase area extending from the cell area in the first direction,
wherein the peripheral circuit device layer includes transistors, peripheral circuit via plugs, and peripheral circuit interconnection layers over a substrate,
wherein the memory cell device layer includes:
a word line stack including interlayer insulating layers and word lines alternately stacked, wherein the word line stack includes end portions arranged in a staircase shape in the staircase area;
a bit line array including bit lines arranged in the cell area; and
word line pillars electrically connected to the end portions of the word lines in the staircase area, respectively,
wherein the pass transistor area is vertically overlapped with the cell area.

2. The three-dimensional semiconductor device of claim 1,
wherein the transistors include:
page buffer transistors disposed in the page buffer area;
pass transistors disposed in the pass transistor area; and
logic transistors disposed in the logic transistor area.

3. The three-dimensional semiconductor device of claim 2,
wherein the word line pillars are electrically connected to the pass transistors, respectively.

4. The three-dimensional semiconductor device of claim 1,
wherein the bit line array is vertically aligned with the page buffer area and the pass transistor area.

5. The three-dimensional semiconductor device of claim 1,
wherein the page buffer area is vertically aligned with the cell area, and
wherein the logic transistor area is vertically aligned with the staircase area.

6. The three-dimensional semiconductor device of claim 1,
wherein the peripheral circuit device layer includes lower bit line bonding via plugs and lower bit line bonding pads over the lower bit line bonding via plugs in the page buffer area and the pass transistor area,
wherein the memory cell device layer includes upper bit line bonding via plugs and upper bit line bonding pads below the upper bit line bonding via plugs in the cell area, and
wherein each of the lower bit line bonding pads and each of the upper bit line bonding pads are directly bonded.

7. The three-dimensional semiconductor device of claim 6,
wherein the peripheral circuit via plugs includes a lower peripheral circuit via plug and an upper peripheral circuit via plug,
wherein the peripheral circuit interconnection layers include a lower peripheral circuit interconnection layer and an upper peripheral circuit interconnection layer,
wherein the lower peripheral circuit via plug is electrically connected to at least one of the transistors disposed in the page buffer area,
wherein the lower peripheral circuit interconnection layer is electrically connected to the lower peripheral circuit via plug,
wherein the upper peripheral circuit via plug is electrically connected to the lower peripheral circuit interconnection layer,
wherein the upper peripheral circuit interconnection layer is electrically connected to the upper peripheral circuit via plug and one of the lower bit line bonding via plugs, and
wherein the upper peripheral circuit via plug and the one of the lower bit line bonding plugs are vertically offset.

8. The three-dimensional semiconductor device of claim 1,
wherein the peripheral circuit device layer includes lower word line bonding via plugs and lower word line bonding pads over the lower word line bonding via plugs in the logic transistor area,
wherein the memory cell device layer includes upper word line bonding via plugs and upper word line bonding pads below the word line bonding via plugs in the staircase area, and
wherein each of the lower word line bonding pads and each of the upper word line bonding pads are directly bonded.

9. The three-dimensional semiconductor device of claim 8,
wherein the peripheral circuit via plugs include a lower peripheral circuit via plug and an upper peripheral circuit via plug, wherein the peripheral circuit interconnection layers include a lower peripheral circuit interconnection layer and an upper peripheral circuit interconnection layer, wherein the lower peripheral circuit via plug is electrically connected to one of the transistors disposed in the page buffer area, wherein the lower peripheral circuit interconnection layer is electrically connected to the lower peripheral circuit via plug, wherein the upper peripheral circuit via plug is electrically connected to the lower peripheral circuit interconnection layer, wherein the upper peripheral circuit interconnection layer electrically connects the upper peripheral circuit via plug to one of the lower word line bonding via plugs, and wherein the upper peripheral circuit via plug and the one of the lower word line bonding plugs are vertically offset.

10. A three-dimensional semiconductor device comprising:

a peripheral circuit device layer and a memory cell device layer stacked over the peripheral circuit device layer, wherein the peripheral circuit device layer includes a page buffer area and a row decoder area adjacent to the page buffer area in a first direction, wherein the memory cell device layer includes a cell area and a staircase area extending from the cell area in the first direction, wherein a first portion of the row decoder area is vertically aligned with the cell area, wherein a second portion of the row decoder area is vertically aligned with the staircase area.

11. The three-dimensional semiconductor device of claim 10, wherein the first portion of the row decoder area includes a pass transistor area, and wherein the second portion of the row decoder area includes a logic transistor area.

12. The three-dimensional semiconductor device of claim 11, wherein the pass transistor area and the logic transistor area are adjacent to each other in the first direction.

13. The three-dimensional semiconductor device of claim 10, wherein the page buffer area is completely overlapped with the cell area in a vertical direction.

14. The three-dimensional semiconductor device of claim 10, wherein the peripheral circuit device layer includes a peripheral circuit area adjacent to the page buffer area in a second direction perpendicular to the first direction, and wherein the page buffer area and the peripheral circuit area are vertically overlapped with the cell area.

15. A three-dimensional semiconductor device comprising:

a bit line array including a plurality of bit lines arranged to be spaced apart from each other in a first direction and to extend in parallel with each other in a second direction, the first direction being perpendicular to the second direction; and a page buffer area including a plurality of page buffer transistors arranged to be spaced apart from each other in the first direction, wherein the plurality of bit lines are arranged in the first direction to form a plurality of bit line groups, wherein each of the plurality of bit line groups includes some of the bit lines, wherein the bit line groups are arranged with a first pitch in the first direction, wherein the plurality of page buffer transistors are arranged with a second pitch in the first direction, and wherein the first pitch is greater than the second pitch.

16. The three-dimensional semiconductor device of claim 15, wherein each of gate electrodes of the pass transistors has a segment shape elongated in the first direction.

17. The three-dimensional semiconductor device of claim 15, further comprising:

a pass transistor area adjacent to the page buffer area in the first direction, and wherein the page buffer area and the pass transistor area are vertically overlapped with the bit line array.

18. The three-dimensional semiconductor device of claim 17, further comprising:

pass transistors arranged with a third pitch in the first direction in the pass transistor area, and wherein the first pitch is greater than the third pitch.

* * * * *